US00RE35806E

United States Patent [19]

Rossi et al.

[11] E Patent Number: Re. 35,806

[45] Reissued Date of Patent: May 26, 1998

[54] MULTIPURPOSE, INTERNALLY CONFIGURABLE INTEGRATED CIRCUIT FOR DRIVING A SWITCHING MODE EXTERNAL INDUCTIVE LOADS ACCORDING TO A SELECTABLE CONNECTION SCHEME

[75] Inventors: Domenico Rossi, Cilavegna; Andrea Cuomo, Milan; Giovanni Pietrobon, Trevisco, all of Italy

[73] Assignee: SGS-Thomson Microelectronics S.r.l., Agrate Brianza, Italy

[21] Appl. No.: 512,904

[22] Filed: Aug. 9, 1995

Related U.S. Patent Documents

Reissue of:

[64] Patent No.: 4,972,130
Issued: Nov. 20, 1990
Appl. No.: 435,889
Filed: Nov. 14, 1989

U.S. Applications:

[63] Continuation of Ser. No. 977,646, Nov. 17, 1992, abandoned.

[30] Foreign Application Priority Data

Nov. 16, 1988 [IT] Italy ..... 83681 A/88

[51] Int. Cl.[6] ..... H03K 17/56

[52] U.S. Cl. ..... 318/293; 318/599

[58] Field of Search ..... 318/256, 257, 318/258, 271, 280, 291, 293, 294, 463, 590, 599; 307/29, 36, 38, 98, 112, 113

[56] References Cited

U.S. PATENT DOCUMENTS

| | | | |
|---|---|---|---|
| 4,523,134 | 6/1985 | Kinoshita et al. | 318/313 |
| 4,544,869 | 10/1985 | Pittaway | 318/293 |
| 4,575,668 | 3/1986 | Baker | 318/811 |
| 4,581,565 | 4/1986 | Van Pelt et al. | 318/294 |
| 4,599,545 | 7/1986 | Moriki et al. | 318/314 |
| 4,605,863 | 8/1986 | Toudo et al. | 307/269 |
| 4,616,305 | 10/1986 | Damiano et al. | 363/132 |
| 4,686,438 | 8/1987 | Ohe et al. | 318/280 |
| 4,800,324 | 1/1989 | Kuttner | 318/293 |
| 4,816,726 | 3/1989 | Novis et al. | 318/293 |
| 4,831,285 | 5/1989 | Gaiser | 307/465 |
| 4,924,158 | 5/1990 | Kelley et al. | 318/434 |

*Primary Examiner*—Bentsu Ro
*Attorney, Agent, or Firm*—Wolf, Greenfield & Sacks, P.C.

[57] ABSTRACT

A multipurpose integrated circuit for driving in a switching mode an externally connected load or loads permits implementation of any appropriate supply scheme of the external load or loads through six output terminals thereof and is therefore useful in a large number of applications. The integrated circuit uses six integrated power switching devices provided with respective recirculation diodes and a single externally connected sensing resistor for generating, by means of a customary PWM control loop, a control signal by which means of a logic circuit configurable by [programaming] *programming* permits the generation of driving signals as a function of the control signal for all six integrated power switches in accordance with a configuration of the driving signals which conforms with the particular scheme of connection of the load or loads selected among the different bridge type and unipolar-motor type schemes which may be selected by programming. A multiplexer is used for selecting among bridge type driving signals and unipolar-motor type driving modes and a ROM provided with two input registers for selecting the specific driving scheme and for regulation, respectively.

17 Claims, 3 Drawing Sheets

MULTIPURPOSE, INTERNALLY CONFIGURABLE INTEGRATED CIRCUIT FOR DRIVING A SWITCHING MODE EXTERNAL INDUCTIVE LOADS ACCORDING TO A SELECTABLE CONNECTION SCHEME

Matter enclosed in heavy brackets [ ] appears in the original patent but forms no part of this reissue specification; matter printed in italics indicates the additions made by reissue.

*This application is a continuation of application Ser. No. 07/977,646, filed Nov. 17, 1992, now abandoned, which is a reissue of application Ser. No. 07/435,889, filed Nov. 14, 1989, and issued as U.S. Pat. No. 4,972,130, on Nov. 20, 1990.*

BACKGROUND OF THE INVENTION

1. Field of the invention

The present invention relates to an integrated circuit which may be internally configured by programming, for controlling the switching of a driving current through a single or multiple inductive loads connected across output terminals of the integrated device in accordance with one of several different connection schemes which may be selected for a particular application.

2. Description of the prior art

The controlled driving of stepping motors, transformers, electromagnets and similar actuating means, typically representing inductive loads, is commonly implemented by employing an integrated device combining the output power transistors, typically four power switching transistors connected to a virtual ground node which are referred to as "low-side drivers" and one or more often two power switching transistors connected to the supply rail, known as "high-side driver(s)", and a driving circuit. The latter typically includes a pulse-width-modulation (PWM) control loop, driven by a clock signal, which controls the "duty-cycle" of driving signals fed to the output power switching transistors in function of the detected value of the current flowing through the external load and of a control reference voltage.

Integrated circuits of this kind are well known to a skilled technician and may take different forms, more or less advantageous under certain aspects, but which essentially remain based upon PWM control loops. Among these types of circuits, particularly advantageous is a control circuit based upon a current sharing principle described in the pending U.S. patent application Ser. No. 07/245,657, filed on Sept. 16, 1988 and claiming a Convention priority date of Oct. 5, 1987, wherein by employing a single current sensing resistor for the current flowing through the external loads, it is possible to adjust independently the current flowing through two external loads connected according to a "dual-half-bridge" scheme or according to a "unipolar motor" connection scheme. The description of such a switching control circuit is here incorporated. On the other hand, the kind of the external inductive load or loads to be driven by the integrated circuit, whether represented by [an] *a* unipolar motor or by one or more unidirectional motors, solenoids, and the like normally requires a specific design of the integrated switching control circuit compatible with the particular drive configuration or connection scheme of the external load or loads to be driven. In the accompanying FIGS. 1a, 1b, 1c and 1d, several well known driving schemes for inductive loads (L), according to a bridge, dual-half-bridge, electromagnet, and unipolar motor drive configuration are respectively depicted. In these illustrations six power switching transistors indicated with HSD1, HSD2 (that is the two High-Side Drivers), LSD1, LSD2, LSD3 and LSD4 (that is the four Low-Side Drivers), respectively, are shown, each being provided with a power diode for the recirculation of the discharge current of the relative external inductive load L. In case of driving an electromagnet, as depicted in FIG. 1c, the integrated circuit may contain also two additional recirculation diodes D1 and D2 as it is well known to a skilled technician. In all the examples shown, a single sensing resistor (Rsense), connected between a virtual ground node and the real ground of the supply circuit is shown. Obviously the use of a single sensing resistor in the case of the circuit of FIG. 1b, that is a dual-half-bridge drive configuration for two external loads L and L', necessarily requires a current sharing kind of switching control circuit when an individual control of the two loads is desired, as described in the above cited application.

According to the prior art, the integrated circuit for controlling the switching must essentially be designed specifically for the contemplated application, for example a bridge type application (FIG. 1a), a unipolar motor application (FIG. 1d), and so forth.

Therefore it would be of great utility to provide an integrated device for controlling the switching of a drive current across external inductive loads (single or multiple loads), which could be internally configured so as to be usable for a driving scheme selectable among a number of possible driving schemes of the externally connected load or loads.

SUMMARY OF THE INVENTION

The main objective of the present invention is that of providing an integrated circuit for controlling the switching which may be internally configured by means of selection logic means controllable by the user for making the control circuit functionally suited for a certain driving scheme of an external load or loads which may be implemented by suitable bridging output terminals of the integrated circuit and connecting the external load of loads thereto.

This and other objectives and advantages which will emerge during the following description, are achieved by the switching mode, driving circuit of the present invention, which may also conveniently use a single PWM control loop utilizing a single sensing resistor connected between a virtual ground node to which four "low-side drivers" are connected and the real ground of the supply circuit and which is capable of generating at least a control signal, the "duty-cycle" of which is determined by means of a clock signal and a reference voltage. This control signal generated by the PWM control loop is substantially fed to the input of a configurable logic circuit, which may comprise a read-only memory (ROM) and/or a similarly programmable logic array (PLA) and suitable selection registers (programming registers). The configurable logic circuit produces drive signals for as many output power switching transistors that are used (that is, for the four "low-side drivers" and for the unique or for the two "high-side drivers") in conformity with a selected driving scheme to be implemented.

According to a preferred embodiment of the invention, the use of relatively slow ROM or PLA, that is, with a relatively long access time, is made possible without such a speed limit of the programmable logic circuit having a negative effect upon the correct driving in a switching mode of the external load or loads.

DESCRIPTION OF PREFERRED EMBODIMENTS

Figure 1A:
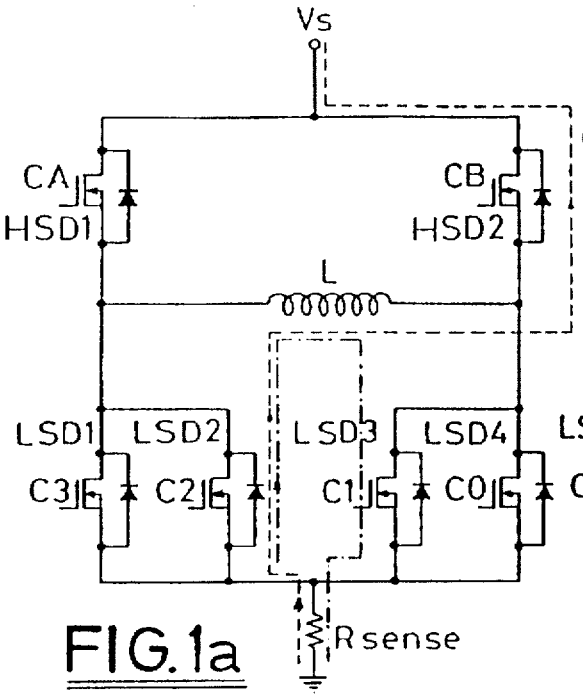
FIG.1a (PRIOR ART)
FIGS. 1a, 1b, 1c and 1d depict driving schemes of one or more external loads which are commonly adopted in the art, as described above.
Figure 2:
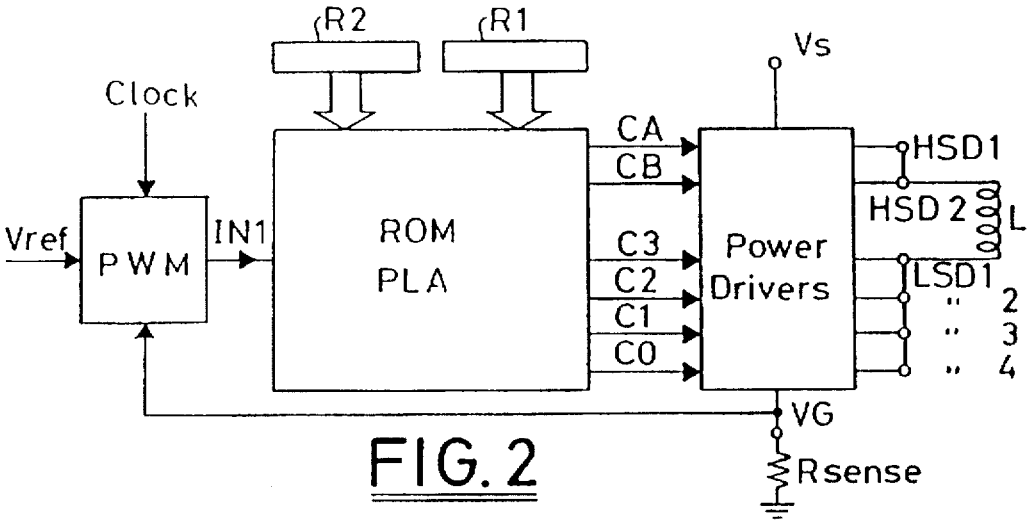
FIG. 2 is a basic block diagram of the integrated driving circuit of the present invention.

A basic block diagram of the integrated driving circuit of the present invention is depicted in FIG. 2. The two power devices connected to the supply rail Vs, that is, the two "high-side drivers" HSD1 and [HSd2] *HSD2*, and the four power devices which are connected to the virtual ground node VG of the output supply circuit, that is the four "low-side drivers" LSD1, LSD2, LSD3 and LSD4, are represented as a whole by the block labelled "power drivers", which has six respective output terminals HSD1, HSD2, LSD1 . . . LSD4, whereby any one of the supply schemes for single or multiple loads depicted in FIGS. 1a, . . . 1d, may be implemented. In the particular example shown in FIG. 2, it is easily recognized that the implemented supply scheme is the one used for controlling an electromagnet. The load L is connected between the two "high-side drivers" and the four "lowside drivers", which are respectively connected in parallel by means of the indicated external connections.

The integrated device has preferably an external terminal VG for allowing the connection of an external sensing resistance Rsense between such a virtual ground terminal VG and the real ground of the circuit powering the external load L.

Figure 1B:
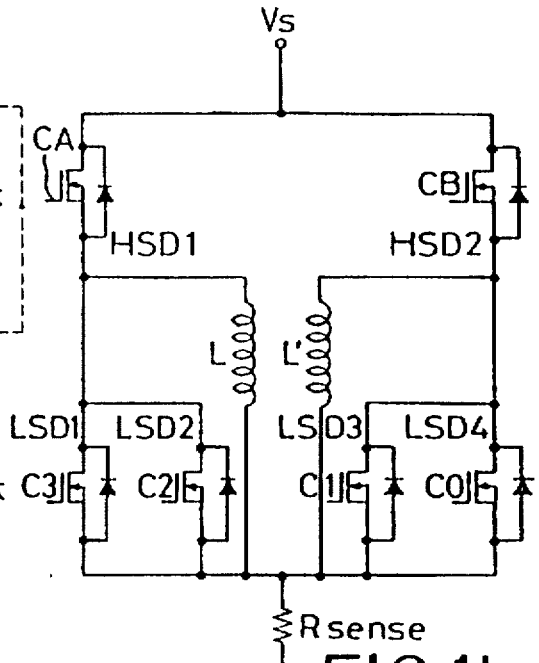
FIG.1b (PRIOR ART)
Figure 1C:
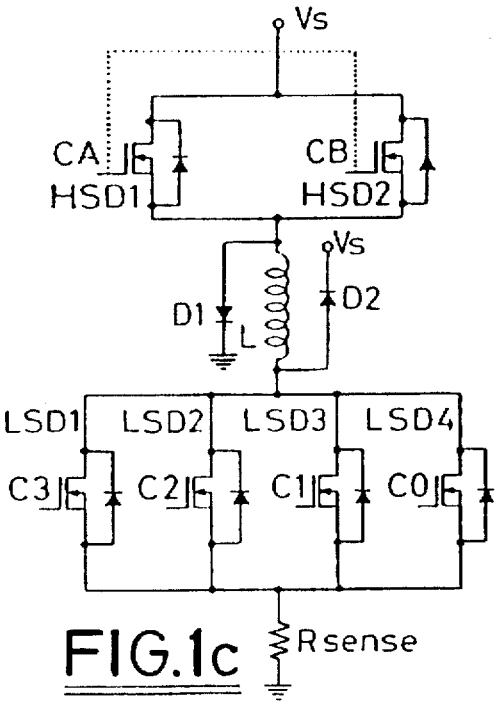
FIG.1c (PRIOR ART)

Naturally the six power switching devices will have customarily a respective integrated diode for recirculation, as shown in FIGS. 1a, 1b, . . . 1d.

The voltage signal across the sensing resistor Rsense is fed to a PWM block wherein such a signal is detected and compared with a control reference voltage Vref and a pulse-width-modulation control circuit generates at least a control signal IN1, the frequency and "duty-cycle" of which may be adjusted by means of the control reference voltage Vref and the Clock signal. The signal (or the two nonsuperimposing driving signals which are needed in case a dual-half-bridge supply scheme for two distinct loads or a supply scheme for a unipolar motor utilizing a single sensing resistor and a single PWM control loop as described in the above cited pending application are implemented) is not fed directly or through inverters to the respective driving terminals of the six output power switching devices but such a driving signal (or two nonsuperimposing driving signals) is fed to an input of a logic circuit labelled ROM - PLA which may be configured by programming and which generates on at least six output terminals thereof, signals which are replica and inverse signals of such a single signal IN1 (or of two nonsuperimposing signals) which is generated by the PWM control loop. The outpost signals (CA, CB, C0, C1, C2 and C3) of the configurable logic circuit (ROM - PLA) are respectively fed to the six driving terminals of the output power drivers. The configurable logic circuit (ROM - PLA) is provided with at least a first register R1 for the selection of the driving configuration of the external load, which is connected, in conformity with such a selected configuration to the relative output terminals of the integrated circuit, a second register R2 for controlling the driving conditions of the load thus connected and preferably a read-only memory (ROM) capable of storing the data of the two registers and/or a logic circuit array whose configuration may be programmed (PLA) and/or equivalent combinatory logic circuitry and determines a configuration of the six output signals in conformity with the data stored in the two registers R1 and R2.

Figure 3:
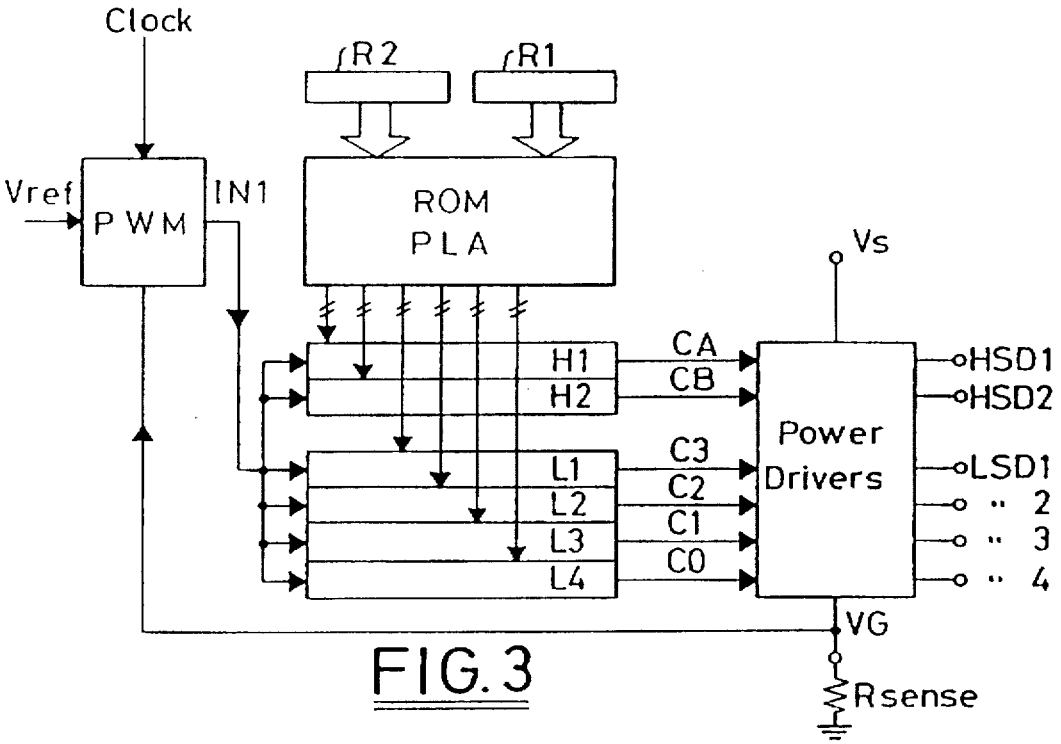
FIG. 3 is a block diagram of an embodiment of the circuit of the present invention suitable to utilize programmable devices having a relatively long access time.
Figure 4:
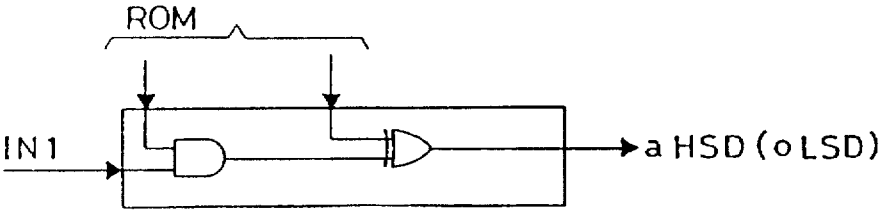
FIG. 4 is a circuit diagram of one of the [block] *blocks* of the diagram of FIG. 3.

In view of the fact that especially when using ROM and/or PLA having a relatively long access time, the delays imputable to the access time of the programmable circuits may interfere with a correct driving in a switching mode of the external load or loads, an embodiment as the one depicted in FIGS. 3 and 4 which is particularly suited when the fabrication technology is such as to determine relatively long access times for ROM and for PLA, may be preferred.

As schematically shown in FIG. 3, the function of selecting the configuration of the six output terminals CA, CB, C0, C1, C2 and C3 of the configurable logic circuit is performed by utilizing six "speed-up" circuits, identified by H1, H2, L1, . . . L4, respectively. Each block is formed by an AND gate followed by an EX-OR gate as depicted in FIG. 4. A first signal of a pair of signals coming from the ROM is fed to an input terminal of the AND gate of the speed-up circuits as a "forcing" signal of a respective logic state and the second is fed to an input terminal of the EX-OR gate of the speed-up circuits as a "selection of inversion" signal. According to this preferred embodiment the use of relatively slow programmable arrays for implementing the read-only-memory function of the integrated circuit of the invention is made possible.

Figure 5:
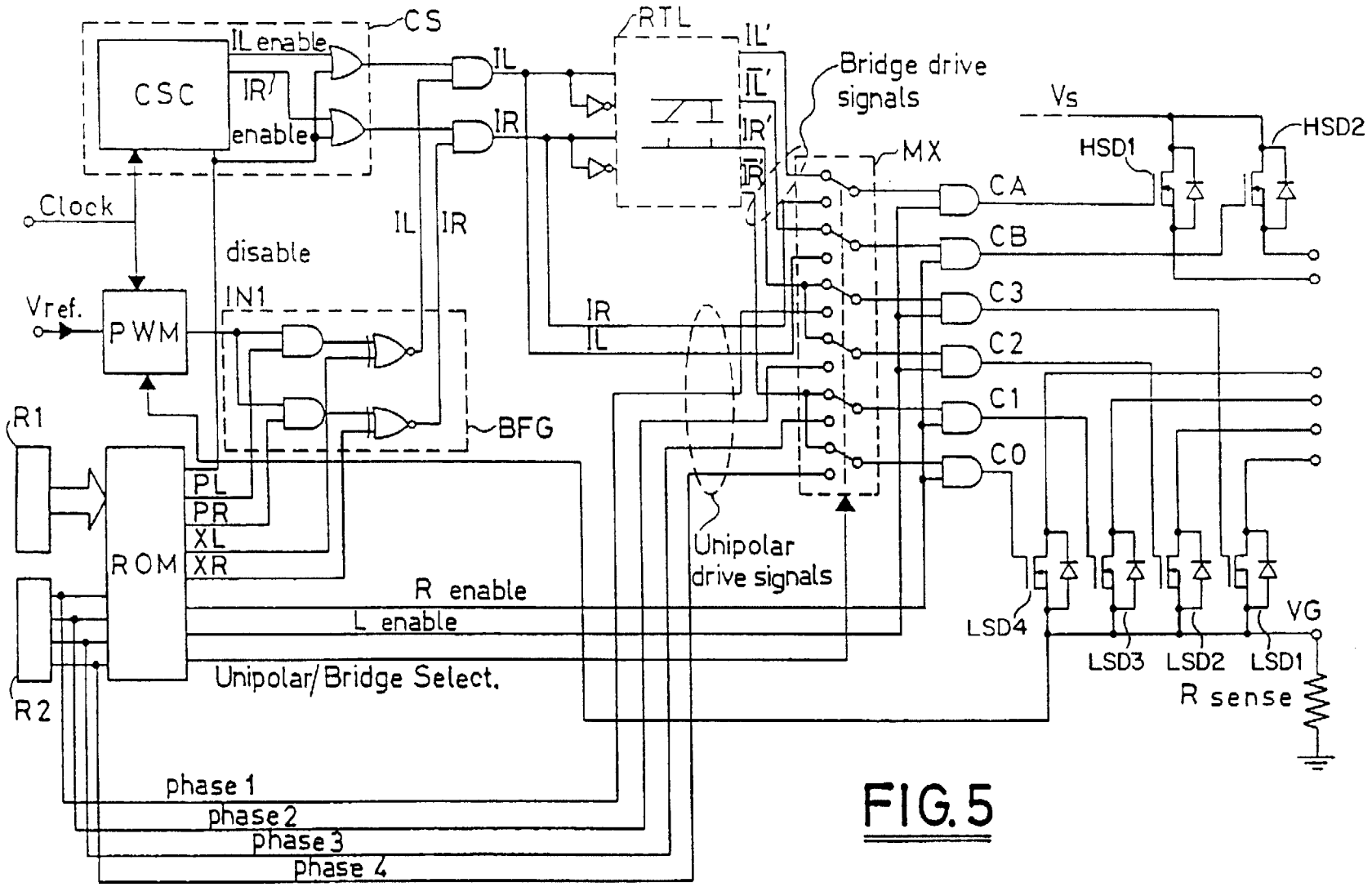
FIG. 5 is a more detailed functional block diagram of a circuit of the present invention.

A more detailed diagram of the circuit of the invention according to such a particularly preferred embodiment, is depicted in FIG. 5.

In the embodiment shown in FIG. 5, the six integrated power switching devices: HSD1, HSD2, LSD1, LSD2, LSD3 and LSD4, provided with their respective recirculation diodes, are shown. Each power switching device commutes a respective output terminal either to the supply rail Vs or to the virtual ground note VG. In the example shown a single external sensing resistor Rsense is connected between the virtual ground note VG and the ground of the supply circuit of one or more external loads (not shown in this figure) which will be connected to the appropriate output terminals, in accordance with a selected supply scheme. Each power switching device is driven by a signal coming respectively from the output terminals CA, CB, C0, C1, C2 and C3 of the programmable logic circuit, as clearly shown.

The voltage signal present across the sensing resistor Rsense, by means of the shown connection, and the control signals Vref and Clock are fed to a PWM control circuit of a substantially customary type. The control signal IN1 produced by the PWM control circuit is fed to the input of a speed-up, "flexibility bridge" circuit BFG, one function of which is that of allowing to control a number of half-bridge circuits, eventually coupled in a bridge configuration, thus permitting to control the driving by means of a single control signal IL or IR (assuming that a "low-side driver" is always inverting in respect to the respective "high-side driver" as it is easily understood by a skilled technician), because by considering for example a single left-hand half-bridge (formed by HSD1, LSD1 and LSD2 of the scheme depicted in FIG. 1b) the control signal IL will always be a function of the signal IN1 or of the inverse of the latter; that is always "high" or always "low", and therefore the AND gate followed by [and] *an* EX-OR gate of the BFG circuit will control the function: IL=S (IN1) through the respective left-phase (PL) and left- inversion (XL) signals coming from the ROM. Obviously the same type of control is duplicated by the BFG circuit through the respective PR an XR signals coming from the ROM for generating an IR driving signal for an eventual right-hand half-bridge (formed by HSD1, LSD3 and LSD4 in FIG. 1b). An advantage of such a solution is the small number of components which are necessary for implementing the double half-bridge control as well as the possibility of employing a very slow ROM, because the delay between the signal IN1 generated by the PWM control circuit and the control signals IL and/or IR remains always extremely small, as already observed in relation to the more general schemes of FIGS. 3 and 4.

As it will be evident to the skilled technician, in a case where a "full-bridge" supply scheme is utilized, the functions of the "current sharing" CS block are no longer required and the signal "CS disable" coming from the ROM will assume a logic value equivalent to "1" such as to disable the two OR output gates of the CS block. In a case where a "dual-half-bridge" or a "unipolar motor" supply scheme is selected, the "CS disable" signal will assume a "ϕ" logic value and the two output signals of the current sharing control circuit "CSC", "IL enable" and "IR enable", are fed to the respective inputs of the two AND gates. The output signals of the two AND gates: IL and IR, essentially correspond to the signals PA and PB of the circuit depicted in FIG. 4 of the cited prior application Ser. No. 245,657 of Sept. 16, 1988, so as the "IL enable" and "IR enable" signals correspond [sustantially] *substantially* to the two signals Qz and $\overline{Qz}$ of that circuit.

In a case where a bridge scheme is selected, the two output signals IL and IR of the two AND gates are fed in a replica and in an inverse form, through the shown inverters, to a lag time generating circuit "RTL", i.e., to a circuit capable of determining a certain delay in the transfer of a positive ramp, which circuit has the function of positively excluding simultaneous conduction of a "high-side driver" and of a respective "low-side driver", according to a common technique.

The pair or the pairs of signals, IL' and $\overline{IL'}$ and IR' and $\overline{IR'}$, respectively, are fed through a multiplexer "MX" to the respective driving terminals of the power switching devices, as it will be described further on.

Figure 1D:
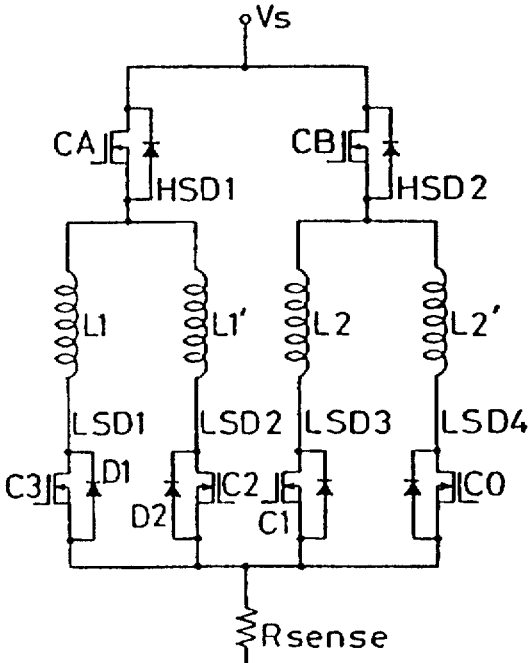
FIG.1d (PRIOR ART)

In a case where a unipolar-motor mode of operation is selected by means of the register R1 (FIG. 1d scheme), the four control phases (phase 1, 2, 3 and 4) are set by means of the register R2 and through the shown connections these signals are fed to the respective inputs of the multiplexer MX to which also the two control signals IR and IL generated as described before by means of the PWM control circuit, the CS current sharing circuit and the BFG circuit are fed. By means of the "unipolar/bridge select" signal coming from the ROM, the multiplexer MX is preset and the six driving signals CA, CB, C3, C2, C1 and C0 for the respective six power switching devices are enabled by means of two enable/disable signals, respectively "R enable" and "L enable" also coming from ROM and which, by means of the six AND gates connected on the six outputs of the multiplexer MX permit to force to an OFF state (disable) the driving signals.

The use of the multiplexer MX is particularly effective for performing a selection among bridge type and unipolar-motor type supply schemes which are radically different from each other and this allows to reduce the number of components which are required for implementing the programmable logic circuitry which is employed in the integrated device of the present invention.

The driving signals relating to the implementation of a bridge type supply scheme or of a solenoid control, are grouped in FIG. 5 by the label "bridge drive signals", while the ensemble of driving signals relating to the implementation of a unipolar-motor supply scheme are labelled "unipolar drive signals" in the diagram of the same FIG. 5.

Notwithstanding the fact that only few preferred embodiments of the invention have been illustrated wherein a ROM is employed, it will be evident to the skilled technician that the ROM may also be substituted by an equivalent logic circuit such as, for example, a programmable logic array (PLA, PAL, etc.) or by equivalent combinatory logic circuitry. Moreover the invention may be practiced in different embodiments, modified in respect to the embodiments which have been described herein for purely illustrative purposes.

What we claim is:

1. An integrated circuit for driving in a switching mode one or more external loads connected, in accordance with a selected supply scheme, to output terminals of the integrated circuit which comprises at least one high-side driver power switching integrated device having a first common pole connected to a power supply of the integrated circuit, four low-side driver power switching integrated devices having a second common pole connected to a virtual ground node of the integrated circuit, a different and second pole of each of said power switching integrated devices being connected respectively to one of a corresponding number of output terminals of the integrated circuit, an external sensing resistor being connected between said virtual ground node and a real ground node of a supply circuit, each of said power switching integrated devices having a driving terminal to which a driving signal is fed, means for detecting and comparing a signal present across said sensing resistor with a control reference voltage, at least a pulse-with-modulation (PWM) control circuit capable of generating at least a substantially square-wave control signal having a frequency and a duty-cycle respectively controlled by means of a clock signal and said control reference voltage, wherein the integrated circuit includes:

at least a logic circuit configurable by programming and capable of receiving, through at least an input terminal thereof, said control signal generated by said PWM control circuit and addressing, through output terminals thereof, toward said driving terminals of said power switching integrated devices, said driving signals which are a function of said control signal; said driving signals addressed to said driving terminals according to a configuration of said output terminals of said configurable [long] *logic* circuit in conformity with a supply scheme of connection of the external load or loads to said output terminals of the integrated circuit, said supply scheme of connection being selected among different bridge and unipolar-motor type schemes of connection.

2. The integrated circuit according to claim 1, wherein said configurable logic circuit comprises:

a first register for selecting the supply scheme of connection of the external load which is connected, in conformity with said selected supply scheme, across said output terminals of the integrated circuit;

a second register for controlling the driving conditions of said externally connected load;

a read-only memory (ROM) or equivalent logic circuit apt to produce a configuration of output signals for conditioning a combinatory logic circuit in conformity with data stored in said first and second registers;

said combinatory logic circuit apt to receive said control signal generated by said PWM control circuit and said output signals produced by said ROM and to produce said driving signals, as a function of said control signal generated by said PWM control circuit, in conformity with said configuration of output signals produced by said ROM;

at least a multiplexer circuit apt to select between bridge type and unipolar-motor type driving mode as a function of an output signal generated by said ROM, and to reproduce said driving signals generated by said combinatory logic circuit and fed to input terminals of said multiplexer circuit, on output terminals of said multiplexer circuit, which are operatively connected to said driving terminals of said power switching integrated devices through enabling/disabling means controlled by enable/disable signals produced by said ROM.

3. The circuit according to claim 2, wherein said enabling/disabling means of said multiplexer include a number of logic AND gates corresponding to the number of multiplexer outputs, each being capable of receiving, through a first input terminal, one of said driving signals coming from one of said output terminals of said multiplexer circuit and, through a second input terminal, an enable/disable signal coming from said ROM and to produce, while in an enable condition, on an output terminal said driving signal which is fed to the driving terminal of the respective power switching integrated circuit.

*4. A programmable circuit for driving an external load connected to output terminals of the circuit in a selected configuration, comprising:*

*a plurality of power switching devices that supply power to the load in response to driving signals supplied to respective driving terminals of the power switching devices;*

*a control circuit, including a detector and a comparator detecting and comparing a feedback signal indicative of power consumed by the load and a control reference signal to generate a control signal having a frequency and a duty-cycle respectively controlled by means of a clock signal and the control reference signal; and*

*a programmable logic circuit, coupled between the control circuit and the plurality of power switching devices and responsive to the control signal generated by the control circuit, for respectively supplying to each driving terminal of the power switching devices a driving signal in conformance with the selected configuration of the external load,*

*wherein said programmable logic circuit is programmable to select one of a plurality of driving configurations such that said selected driving configuration corresponds to said selected configuration of the external load.*

*5. The programmable circuit of claim 4, wherein the programmable logic circuit further comprises:*

*a first register for selecting a configuration to match the selected configuration of the external load; and*

*a second register for controlling the driving conditions of the externally connected load.*

*6. The programmable circuit of claim 5, wherein the programmable logic circuit further comprises:*

*a logic circuit, coupled to and responsive to signals generated by the first and second registers, to produce a configuration of output signals for driving the plurality of power switching devices in conformity with data stored in the first and second registers.*

*7. The programmable circuit of claim 6, wherein the programmable logic circuit further comprises at least one combinatory logic circuit respectively coupled between the logic circuit and the plurality of power switching devices, the combinatory logic circuit being responsive to the control signal generated by the control circuit and the output signals of the logic circuit to produce the driving signal.*

*8. The programmable circuit of claim 7, further comprising a multiplexer circuit coupled between the combinatory logic circuit and the plurality of power switching devices to select between a bridge type and a unipolar type inductive load driving mode in response to the output signals generated by the logic circuit and to supply selected driving signals to the driving terminals of the plurality of power switching devices.*

*9. The programmable circuit of claim 8, further comprising an enabling/disabling circuit coupled between the multiplexer circuit and the plurality of power switching devices for operatively controlling operation of the power switching devices in response to signals generated by the logic circuit.*

*10. The programmable circuit of claim 9, wherein the circuit is constructed as an integrated circuit.*

*11. The programmable circuit of claim 9, wherein the logic circuit is a read only memory.*

*12. The programmable circuit of claim 9, wherein the logic circuit is a programmable logic array.*

*13. The programmable circuit of claim 9, wherein the control circuit is a pulse width modulator.*

*14. The programmable circuit of claim 9, wherein the plurality of power switching devices are coupled between a power supply voltage and a virtual ground and further comprising a sense resistor coupled between the virtual ground and a circuit ground wherein the feedback signal is generated by a current flowing through the sense resistor.*

*15. The programmable circuit of claim 9, wherein the external load is a motor.*

*16. A programmable circuit for driving an external load connected to output terminals of the circuit in a selected configuration, comprising:*

*power switching means for supply power to the load in response to driving signals supplied to respective driving terminals;*

*control circuit means, including means for detecting and comparing a feedback signal indicative of power consumed by the load and a control reference signal, for generating a control signal having a frequency and a duty-cycle respectively controlled by means of a clock signal and the control reference signal; and*

*programmable logic circuit means, coupled between the control circuit means and the power switching means and responsive to the control signal generated by the control circuit means, for respectively supplying to each driving terminal of the power switching means a driving signal in conformance with the selected configuration of the external load,*

*wherein said programmable logic circuit means is programmable to select one of a plurality of driving configurations such that said selected driving configuration corresponds to said selected configuration of the external load.*

*17. A programmable circuit for driving an external load connected to output terminals of the circuit in a selected configuration, comprising:*

*at least one power switching device that supplies power to the load in response to a driving signal supplied to a driving terminal thereof;*

*control circuit including means for detecting and comparing a feedback signal indicative of power consumed by the load and a control reference signal to generate a control signal having a frequency and a duty-cycle respectively controlled by means of a clock signal and the control reference signal; and*

*a programmable logic circuit, coupled between the control circuit and the at least one power switching device and responsive to the control signal generated by the control circuit, for supplying to the driving terminal a driving signal that conforms with the selected configuration of the external load,*

*wherein said programmable logic circuit is programmable to select one of a plurality of driving configurations such that said selected driving configuration corresponds to said selected configuration of the external load.*

* * * * *